United States Patent
Wang et al.

(10) Patent No.: US 11,974,462 B2
(45) Date of Patent: Apr. 30, 2024

(54) DISPLAY PANEL AND DISPLAY DEVICE (71) Applicant: BOE Technology Group Co., Ltd., Beijing (CN)

(72) Inventors: Ling Wang, Beijing (CN); Yicheng Lin, Beijing (CN); Pan Xu, Beijing (CN); Guoying Wang, Beijing (CN); Guang Yan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 958 days.

(21) Appl. No.: 16/962,679

(22) PCT Filed: Feb. 25, 2020

(86) PCT No.: PCT/CN2020/076671
§ 371 (c)(1),
(2) Date: Jul. 16, 2020

(87) PCT Pub. No.: WO2020/207135
PCT Pub. Date: Oct. 15, 2020

(65) Prior Publication Data
US 2021/0384275 A1  Dec. 9, 2021

(30) Foreign Application Priority Data
Apr. 10, 2019 (CN) .......................... 201910284100.4

(51) Int. Cl.
*H10K 59/121* (2023.01)
*H10K 59/131* (2023.01)
(Continued)

(52) U.S. Cl.
CPC ....... *H10K 59/1213* (2023.02); *H10K 59/131* (2023.02); *H01L 27/1214* (2013.01);
(Continued)

(58) Field of Classification Search
CPC ............ H10K 59/1213; H10K 59/131; H10K 59/122; H10K 59/126; H10K 59/124; H01L 27/1214
(Continued)

(56) References Cited

U.S. PATENT DOCUMENTS

2011/0221661 A1   9/2011 Yoon et al.
2015/0054719 A1   2/2015 Lee et al.
(Continued)

FOREIGN PATENT DOCUMENTS

CN   102194853 A   9/2011
CN   104134683 A   11/2014
(Continued)

OTHER PUBLICATIONS

Song et al., A Transparent Display Panel and Manufacturing Method of the Display Device and a Transparent Display Panel, Jan. 1, 2019, PE2E machine-language translation (Year: 2019).*
(Continued)

*Primary Examiner* — Tu-Tu V Ho
(74) *Attorney, Agent, or Firm* — ArentFox Schiff LLP; Michael Fainberg (57) ABSTRACT

Disclosed are a display panel and a display device. The display panel includes a base substrate; a plurality of data signal lines on the base substrate, and a plurality of pixel units; and each pixel unit has a transparent area and a non-transparent area; the pixel unit includes a plurality of sub-pixels in the non-transparent area. All sub-pixels in the display panel are arranged in an array, each column of sub-pixels corresponds to a respective one of the data signal lines, and at least part of the data signal lines are arranged around the transparent areas.

14 Claims, 9 Drawing Sheets

(51) Int. Cl.
  *H01L 27/12* (2006.01)
  *H10K 59/122* (2023.01)
  *H10K 59/124* (2023.01)
  *H10K 59/126* (2023.01)
(52) U.S. Cl.
  CPC ......... *H10K 59/122* (2023.02); *H10K 59/124* (2023.02); *H10K 59/126* (2023.02)
(58) Field of Classification Search
  USPC .......................................... 257/72
  See application file for complete search history.

(56) References Cited

U.S. PATENT DOCUMENTS

| | | |
|---|---|---|
| 2015/0187860 A1 | 7/2015 | Seo et al. |
| 2017/0317155 A1 | 11/2017 | Oh et al. |
| 2018/0145121 A1 | 5/2018 | Park et al. |
| 2018/0357964 A1* | 12/2018 | Shin .................... H10K 59/1216 |
| 2019/0207156 A1* | 7/2019 | Gil ........................ H10K 50/844 |
| 2020/0066820 A1 | 2/2020 | Song et al. |
| 2020/0152101 A1 | 5/2020 | Li et al. |

FOREIGN PATENT DOCUMENTS

| | | |
|---|---|---|
| CN | 104425554 A | 3/2015 |
| CN | 104752477 A | 7/2015 |
| CN | 106205386 A | 12/2016 |
| CN | 106683605 A | 5/2017 |
| CN | 108091672 A | 5/2018 |
| CN | 109118956 A | 1/2019 |
| CN | 109950293 A | 6/2019 |

OTHER PUBLICATIONS

Office Action Action for corresponding Chinese Application No. 201910284100.4 dated Aug. 10, 2020.

* cited by examiner

DISPLAY PANEL AND DISPLAY DEVICE

CROSS REFERENCE TO RELATED APPLICATION

This application is a national phase entry under 35 U.S.C. § 371 of International Application No. PCT/CN2020/076671, filed on Feb. 25, 2020, which claims the priority of the Chinese Patent Application No. 201910284100.4, filed with the China National Intellectual Property Administration on Apr. 10, 2019 and entitled "Display Panel and Display Device", which is hereby incorporated by reference in its entirety.

FIELD

The present disclosure relates to the field of display technology, and particularly relates to a display panel and a display device.

BACKGROUND

With the advantages of self-luminescence and low energy consumption, electroluminescent diodes such as organic light emitting diodes (OLEDs) and quantum dot light emitting diodes (QLEDs) have become one of the hotspots in the applied research field of electroluminescent display panels at present, and also a mainstream technology for preparing transparent display devices.

A transparent display device generally includes a plurality of pixel units, and each pixel unit includes a transparent area and a non-transparent area. However, as signal lines in the pixel unit pass through the transparent area, the transparent area is divided into smaller areas, and the signal lines cause serious light scattering, resulting in high haze and poor transparent display effect.

SUMMARY

An embodiment of the present disclosure provides a display panel, including:
 a base substrate;
 a plurality of data signal lines on the base substrate; and
 a plurality of pixel units, where the plurality of pixel units each has a transparent area and a non-transparent area, and comprises a plurality of sub-pixels in the non-transparent area;
 where all sub-pixels of the display panel are arranged in an array, each column of sub-pixels corresponds to a respective one of the plurality of data signal lines, and at least part of the data signal lines being arranged around transparent areas.

In some embodiments, no data signal line is arranged in the transparent areas.

In some embodiments, the display panel further includes a plurality of fixed voltage signal lines, wherein no fixed voltage signal line is arranged in the transparent areas.

In some embodiments, the display panel further includes a plurality of detection signal lines, where each column of pixel units corresponds to a respective one of the plurality of detection signal lines; and no detection signal line is arranged in the transparent areas.

In some embodiments, the plurality of detection signal lines, the plurality of data signal lines and the plurality of fixed voltage signal lines are located in column gaps between every two adjacent columns of pixel units; and in a same column gap, a detection signal line, data signal lines and a fixed voltage signal line extend in a column direction, and the fixed voltage signal line is located between the detection signal line and the data signal lines.

In some embodiments, a data signal line located in the column gap corresponds to a nearest column of sub-pixels in one column of pixel units, and a data signal line corresponding to other column of sub-pixels in the one column of pixel units is arranged around the transparent areas.

In some embodiments, the data signal line arranged around the transparent areas comprises a first segment located in the column gap and a second segment located in the non-transparent areas; where the second segment includes a first sub-segment extending in the column direction and a second sub-segment extending in a row direction; and the first sub-segment is arranged in a gap between two adjacent sub-pixels.

In some embodiments, the plurality of pixel units each includes a first sub-pixel, a second sub-pixel and a third sub-pixel arranged in that order in the row direction, where a data signal line corresponding to the first sub-pixel is arranged in the column gap; the first sub-segment corresponding to the second sub-pixel is arranged in the gap between the first sub-pixel and the second sub-pixel, and the first sub-segment corresponding to the third sub-pixel is arranged in the gap between the second sub-pixel and the third sub-pixel; or the first sub-segments corresponding to the second sub-pixel and the third sub-pixel are both arranged in the gap between the second sub-pixel and the third sub-pixel.

In some embodiments, each pixel unit includes a first sub-pixel, a second sub-pixel, a third sub-pixel and a fourth sub-pixel successively arranged in the row direction; the data signal line corresponding to the first sub-pixel is arranged in the column gap; and the first sub-segment corresponding to the second sub-pixel is arranged in the gap between the first sub-pixel and the second sub-pixel, the first sub-segment corresponding to the third sub-pixel is arranged in the gap between the second sub-pixel and the third sub-pixel, and the first sub-segment corresponding to the fourth sub-pixel is arranged in the gap between the third sub-pixel and the fourth sub-pixel.

In some embodiments, the fixed voltage signal lines include one of high voltage power lines, reference voltage signal lines and initialization voltage signal lines.

In some embodiments, each sub-pixel includes a thin film transistor, a first electrode, a light-emitting functional layer and a second electrode, wherein the first electrode is electrically connected with the thin film transistor; and an orthographic projection of an area where the thin film transistor is located on the base substrate and an orthographic projection of an area where the first electrode is located on the base substrate are both located in the non-transparent area.

In some embodiments, each sub-pixel further includes a light-shielding layer corresponding to at least one of the thin film transistor; the thin film transistor is a top-gate thin film transistor; the light-shielding layer is located between an active layer of the thin film transistor and the base substrate; and an orthographic projection of the light-shielding layer on the base substrate covers an orthographic projection of the active layer of the corresponding thin film transistor on the base substrate.

In some embodiments, the light-shielding layer is made of a conductive material; and the light-shielding layer is electrically connected to a gate of the corresponding thin film transistor.

In some embodiments, each thin film transistor corresponds to one light-shielding layer respectively.

Correspondingly, an embodiment of the present disclosure further provides a display device including the above-mentioned display panel.

DETAILED DESCRIPTION OF THE EMBODIMENTS

To make the objects, technical solutions, and advantages of the present disclosure more apparent, specific implementations of a display panel and a display device provided by embodiments of the present disclosure are described in detail below in conjunction with the accompanying drawings. It should be understood that the preferred embodiments described below are only used for describing and explaining the present disclosure, instead of limiting the present disclosure. Moreover, the embodiments in the present application and the features in the embodiments may be combined with each other without conflicts. It should be noted that the thickness and shape of each layer of film in the drawings do not reflect the true scale, and are merely intended to illustrate the present disclosure. Furthermore, same or similar reference numerals throughout represent same or similar elements or elements having same or similar functions.

Figure 1:
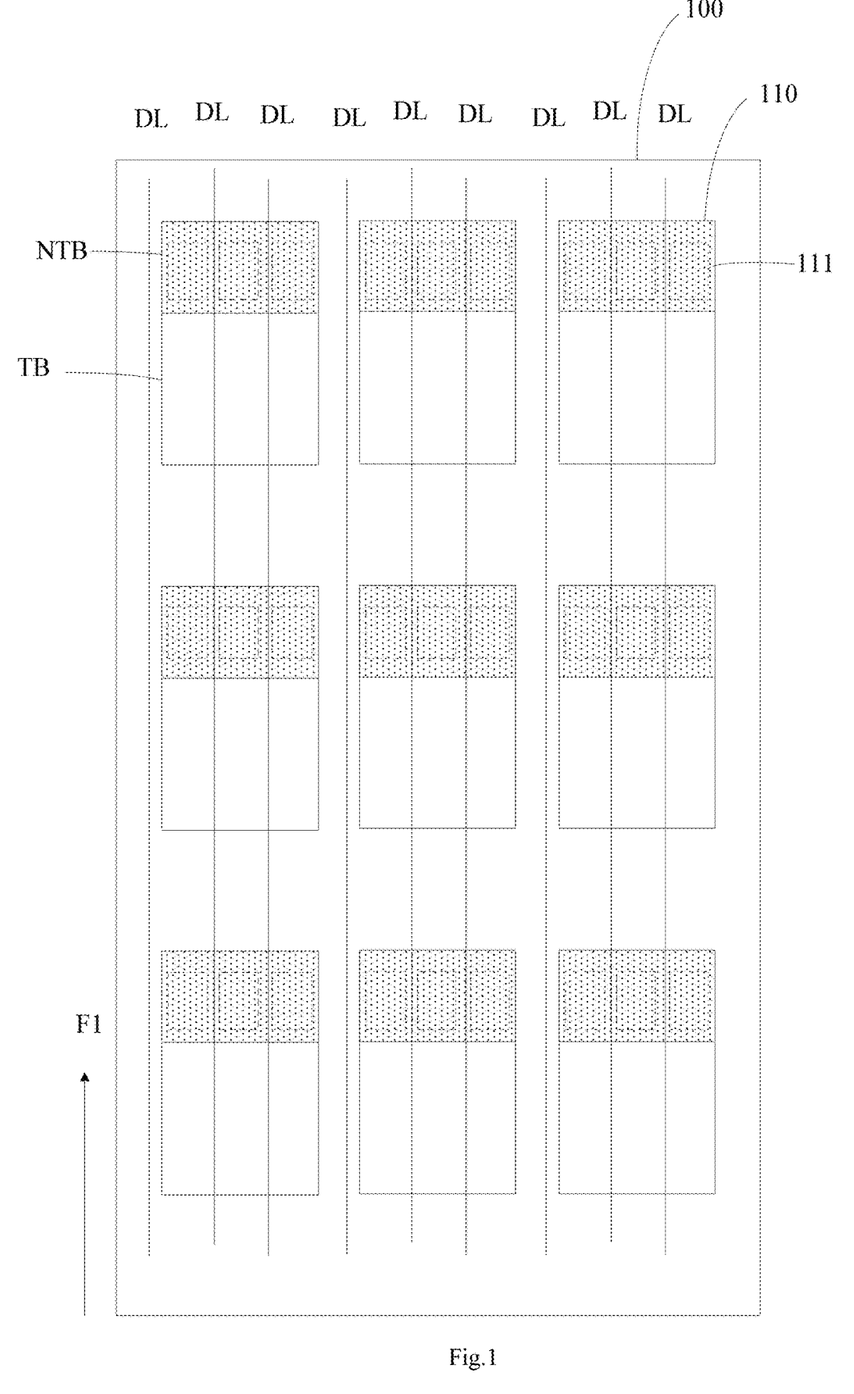
FIG. 1 is a top-view of a display panel in the related art.

As a brand-new display technology, transparent display allows a viewer to see a background behind a display screen, and thus has attracted extensive attention. In some embodiments, as shown in FIG. 1, a display panel may include a base substrate 100, a plurality of pixel units 110 on the base substrate 100, and a plurality of data signal lines DL. Each pixel unit 110 includes a plurality of sub-pixels 111, and each column of sub-pixels 111 corresponds to a respective one of data signal lines DL. Each pixel unit 111 includes a transparent area TB and a non-transparent area NTB. Thus, the display panel may be used as a transparent display panel.

Figure 2A:
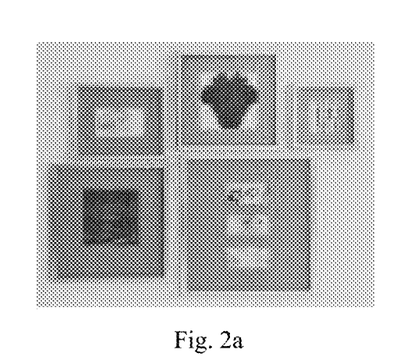
FIGS. 2a to 2g are respectively schematic diagrams of displayed pictures of the display panel.
Figure 2B:
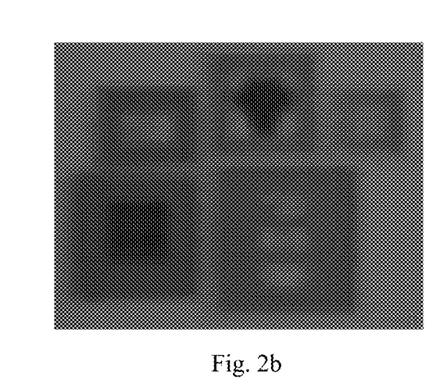
Figure 2C:
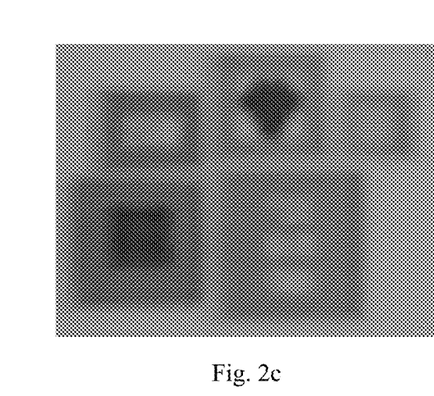
Figure 2D:
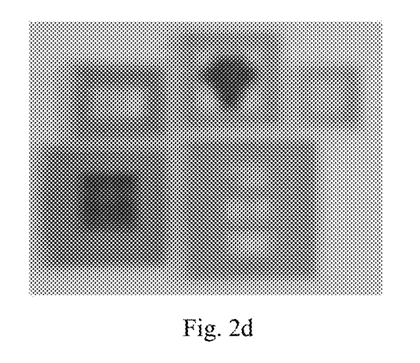
Figure 2E:
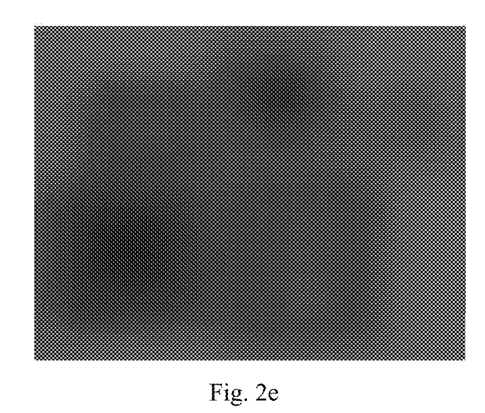
Figure 2F:
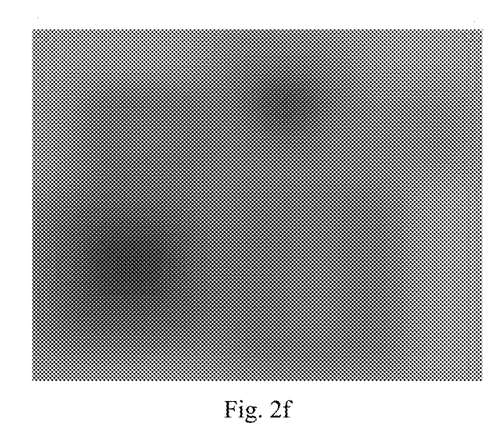
Figure 2G:
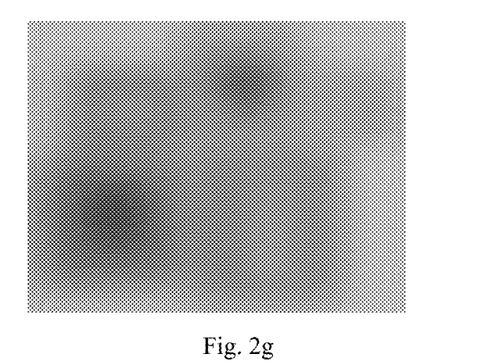

Generally, the perspective effect of a transparent display panel is influenced by two parameters: transmittance and haze. As shown in FIGS. 2a to 2g, FIG. 2a shows an original image, FIG. 2b shows an image passed through the transparent display panel when the transmittance is 20% and the haze is 7%, FIG. 2c shows an image passed through the transparent display panel when the transmittance is 50% and the haze is 7%, FIG. 2d shows an image passed through the transparent display panel when the transmission rate of 80% and the haze is 7%, FIG. 2e shows an image passed through the transparent display panel when the transmission is 20% and the haze is 80%, FIG. 2f shows an image passed through the transparent display panel when the transmittance is 50% and the haze is 80%, and FIG. 2g shows an image passed through the transparent display panel when the transmittance is 80% and the haze is 80%. As can be seen from FIGS. 2a to 2g, the higher the transmittance and the lower the haze, the clearer the image passed through the transparent display panel is, and the higher the brightness is.

Figure 3:
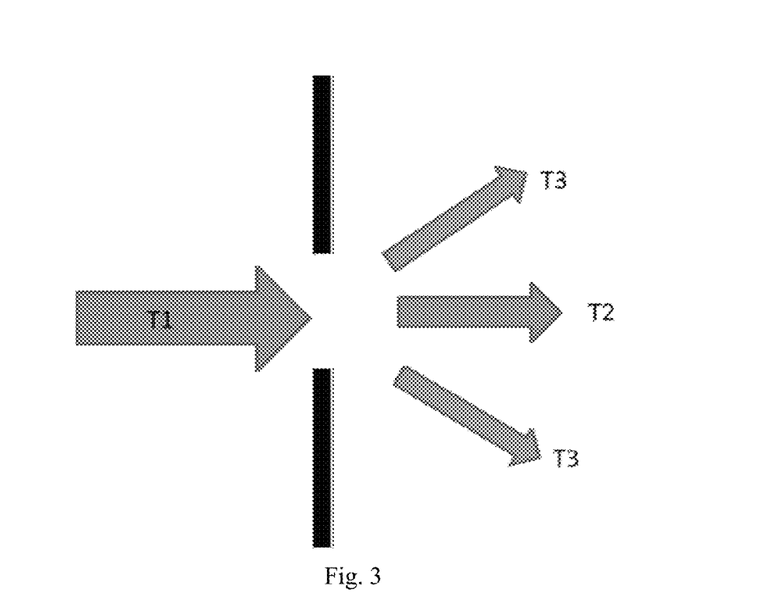
FIG. 3 is a schematic diagram of light propagation through the display panel.

Referring to FIG. 3, generally the transmittance refers to the ratio of a luminous flux $T2_G$ of light T2 emergent from the display panel to a luminous flux $T1_G$ of light T1 incident on the display panel, i.e.

$$\frac{T2_G}{T1_G}.$$

Generally, the haze refers to the percentage of transmitted light intensity of transmitted light T3 that deviates from the incident light T1 by an angle of more than 2.5° to total transmitted light intensity. Therefore, it can be seen that the larger the area of the transparent area, the higher the transmittance is; and the more the reflective metal, the more serious the light scattering is, and the greater the haze is. Moreover, as the material of the data signal lines are generally a metal material, the haze is increased, thereby reducing the clarity of an image passed through the transparent display panel.

Figure 4:
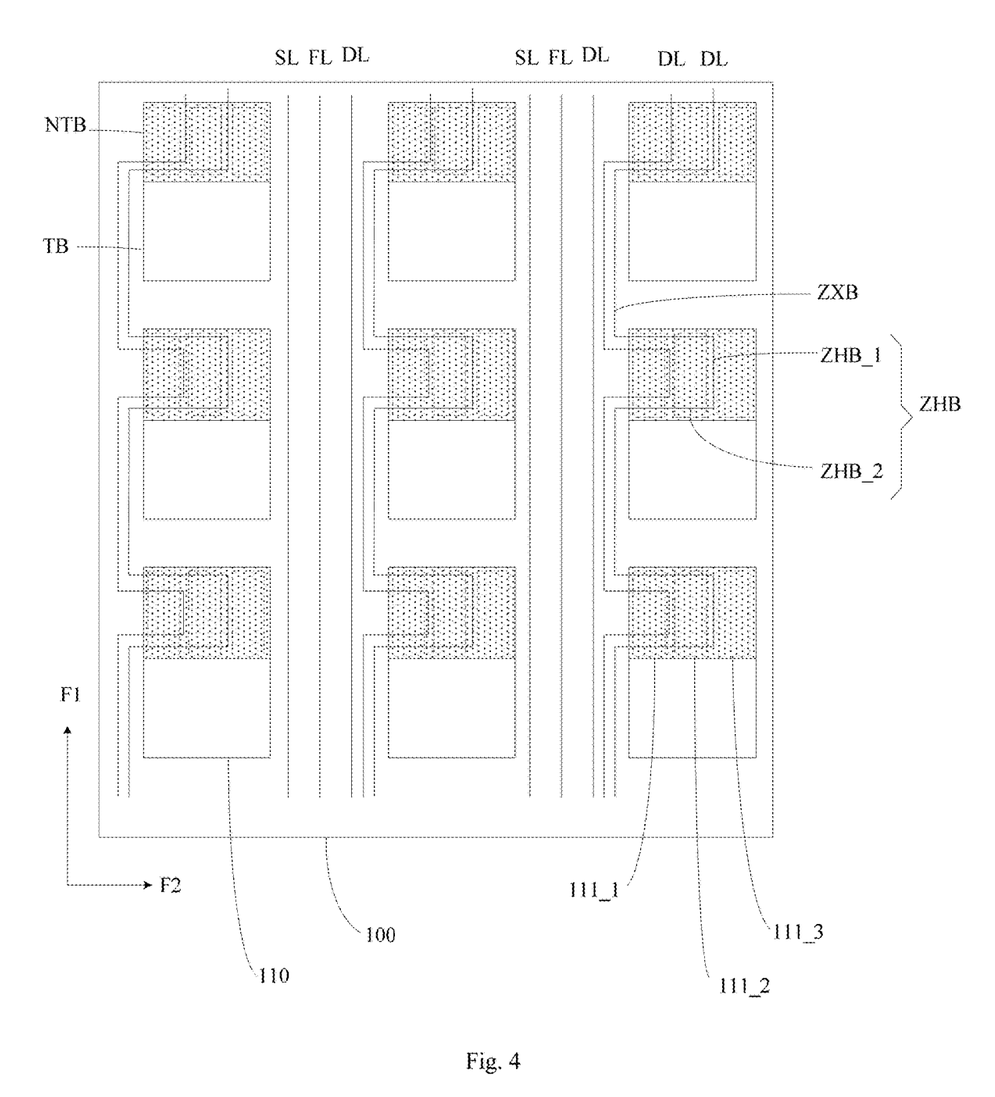
FIG. 4 is a first top-view of a display panel provided by an embodiment of the present disclosure.

Based on this, an embodiment of the present disclosure provides a display panel, as shown in FIG. 4, including:

a base substrate 100; and a plurality of data signal lines DL on the base substrate 100, wherein the display panel includes a plurality of pixel units 110; and each pixel unit 110 has a transparent area TB and a non-transparent area NTB, and the pixel unit 110 includes a plurality of sub-pixels 111_$m$ (1≤m≤M, and m is an integer; M represents the total number of sub-pixels in a pixel unit; and FIG. 4 uses M=3 as an example) in the non-transparent area NTB; and the plurality of sub-pixels 111_$m$ in the display panel are arranged in an array, each column of sub-pixels 111_$m$ corresponds to a respective one of data signal lines DL, and at least part of the data signal lines DL are arranged around the transparent areas TB.

In the display panel provided by the embodiment of the present disclosure, as at least part of the data signal lines are arranged around the transparent areas, not only can the amount of reflective metal passing through the transparent areas be reduced, but also areas intended for arranging the data signal lines may be used as transparent areas to increase the area of the transparent areas, thereby increasing the transmittance, reducing the haze, and improving the display effect.

In practical applications, the number of data signal lines surrounding a transparent area may be set according to the actual wiring. For example, the transparent area TB shown in FIG. 4 may be configured to be surrounded by two data signal lines DL. In addition, the transparent area may also be surrounded by one data signal line, or the transparent area may also be surrounded by more data signal lines, which is not limited herein. To reduce the haze to a greater extent and improve the display effect, in an embodiment of the present disclosure, as shown in FIG. 4, none of the transparent areas TB is provided with the data signal lines DL, that is, the data signal lines DL do not pass through the transparent areas TB.

In some embodiments, as shown in FIG. 4, the display panel may further include a plurality of fixed voltage signal lines FL.

None of the transparent areas TB is provided with the fixed voltage signal lines FL.

The fixed voltage signal lines FL can provide a stable fixed voltage signal to the pixel units. One fixed voltage signal line FL may correspond to one column of pixel units 110, or one fixed voltage signal line FL may correspond to multiple columns of pixel units 110. Thus, the fixed voltage signal lines FL may be arranged in gaps between every two adjacent columns of pixel units 110, to avoid that the fixed voltage signal lines FL pass through the transparent areas TB, so that the amount of reflective metal passing through the transparent areas is reduced, and areas intended for arranging the fixed voltage signal lines may be used as transparent areas to increase the area of the transparent areas, thereby increasing the transmittance, further reducing the haze, and improving the display effect.

Further, in an embodiment of the present disclosure, as shown in FIG. 4, the display panel may further include a plurality of detection signal lines SL.

Each column of pixel units 110 corresponds to a respective one of detection signal lines SL; and none of the transparent areas TB are provided with the plurality of detection signal lines SL.

In some embodiments, each detection signal line SL may correspond to a respective one of columns of pixel units 110, and the detection signal lines SL may be arranged in gaps between every two adjacent columns of pixel units 110, to avoid that the detection signal lines SL pass through the transparent areas TB, so that the amount of reflective metal passing through the transparent areas is reduced, and areas originally used for arranging the detection signal lines SL may be used as transparent areas to increase the area of the transparent areas, thereby increasing the transmittance, further reducing the haze, and improving the display effect.

The function of the detection signal lines SL is described in detail below in conjunction with FIG. 5.

Figure 5:
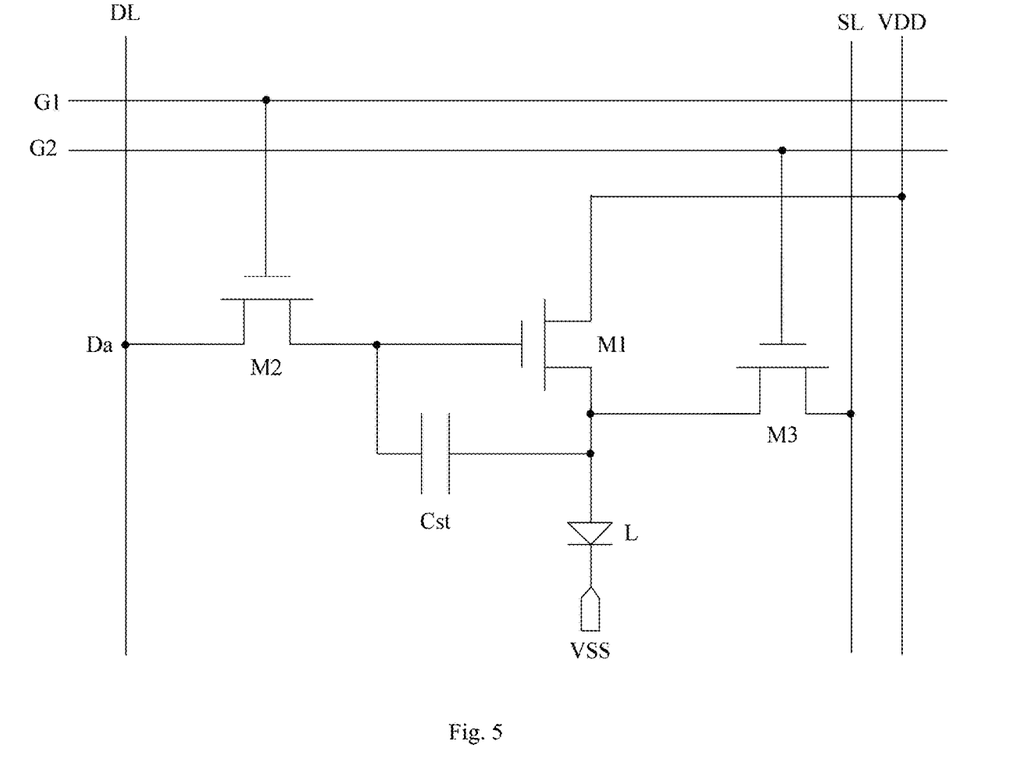
FIG. 5 is a schematic structural diagram of a pixel circuit in an embodiment of the present disclosure.

As shown in FIG. 5, a pixel circuit may generally include a driving transistor M1, a switching transistor M2 and a storage capacitor Cst. The pixel circuit controls the switching transistor M2 to be turned on through a gate scan signal transmitted by a gate line G1 to write a data signal Da transmitted by a data signal line DL to a gate of the driving transistor M1, and a high voltage signal of a fixed voltage transmitted by a high voltage power line VDD is applied to a source of the driving transistor M1, so that the driving transistor M1 generates an operating current to drive an electroluminescent diode L to emit light. However, with the elapse of time of use, the driving transistor M1 may age, so that the threshold voltage of the driving transistor M1 drifts, thus resulting in a difference in display brightness.

To ensure the display quality, the threshold voltage of the driving transistor M1 may be compensated in an external compensation manner. As shown in FIG. 5, the detection signal lines SL may be provided in the display panel, and the detection transistor M3 is provided in each pixel circuit, the detection transistor M3 being connected to a drain of the driving transistor M1. In compensation of a row of sub-pixels in the display panel, a gate scan signal transmitted on a gate line G2 may be used to successively control the pixel circuit in each sub-pixel in the row to charge the detection signal line SL, then a voltage on each detection signal line SL is detected, and compensation calculation is performed according to the detected voltage to achieve external compensation.

However, in the display panel, one column of sub-pixels is correspondingly connected to one data signal line, and one column of pixel units is correspondingly connected to one detection signal line, so there may be a data signal line and a detection signal line arranged in the column gap between the same pixel unit columns. Due to a coupling capacitance between the data signal line and the detection signal line, when a data signal is transmitted on the data signal line, the interference with the detection signal line located in the same column gap is great, so that a signal on the detection signal line is not accurate, thereby causing the problem that a data signal obtained by compensation calculation is inaccurate, thus affecting a picture display effect.

To solve the problem that the data signal line interferes greatly with the detection signal line, in an embodiment of the present disclosure, as shown in FIG. 4, the detection signal lines SL, the data signal lines DL and the fixed voltage signal lines FL are provided in column gaps between every two adjacent columns of pixel units 110; and the detection signal line SL, the data signal line DL and the fixed voltage signal line FL located in the same column gap extend in a column direction, and the fixed voltage signal line FL is arranged between the detection signal line SL and the data signal line DL in the same column gap.

In this way, by arranging the fixed voltage signal line between the detection signal line and the data signal line in the same column gap, as a signal transmitted by the fixed voltage signal line is a stable fixed voltage signal, and its voltage change is small and even negligible, the data signal line and the detection signal line can be separated to reduce the direct interference with the signal transmitted on the detection signal line by the signal transmitted on the data signal line, thereby improving the accuracy of the signal transmitted on the detection signal line and improving the picture display effect.

To reduce signal delay, in some embodiments, the materials of the data signal line, the detection signal line and the fixed voltage signal line include a metal material, such as copper, aluminum, gold or silver, which is not limited herein. Moreover, the fixed voltage signal line, the data signal line and the detection signal line may be prepared in the same layer by using the same material, and thus these signal lines may be formed by the same patterning process, thereby reducing the preparation difficulty of the process and reducing the cost.

In some embodiments, referring to FIG. 5, the pixel circuit may be a pixel circuit capable of implementing external compensation of the threshold voltage. The above-mentioned fixed voltage signal line may include a high voltage power line. The high voltage power line VDD transmits a high voltage signal of a fixed voltage, and the high voltage power line VDD may be arranged between the detection signal line and the data signal line in the same column gap.

Alternatively, the pixel circuit may also be a pixel circuit capable of implementing internal compensation of the threshold voltage, and the above-mentioned fixed voltage signal line may include one of a high voltage power line, a reference voltage signal line and an initialization voltage signal line. The high voltage power line VDD transmits a high voltage signal of a fixed voltage, the reference voltage signal line transmits a reference voltage signal of a fixed voltage, and the initialization voltage signal line transmits an initialization voltage signal of a fixed voltage. In practical applications, the pixel circuit is generally also connected to at least one of a high voltage power line VDD, a reference voltage signal line or an initialization voltage signal line, and the at least one of a high voltage power line VDD, a reference voltage signal line or an initialization voltage signal line may be arranged between the detection signal line and the data signal line in the same column gap.

In some embodiments, the display panel is further provided with a plurality of gate lines. To reduce signal delay, the material of the gate lines may include a metal material, such as copper, aluminum, gold or silver, which is not limited herein. In an embodiment of the present disclosure, at least one gate line may be arranged in a row gap between every two adjacent rows of pixel units. This can avoid that the gate lines pass through the transparent areas.

Figure 6:
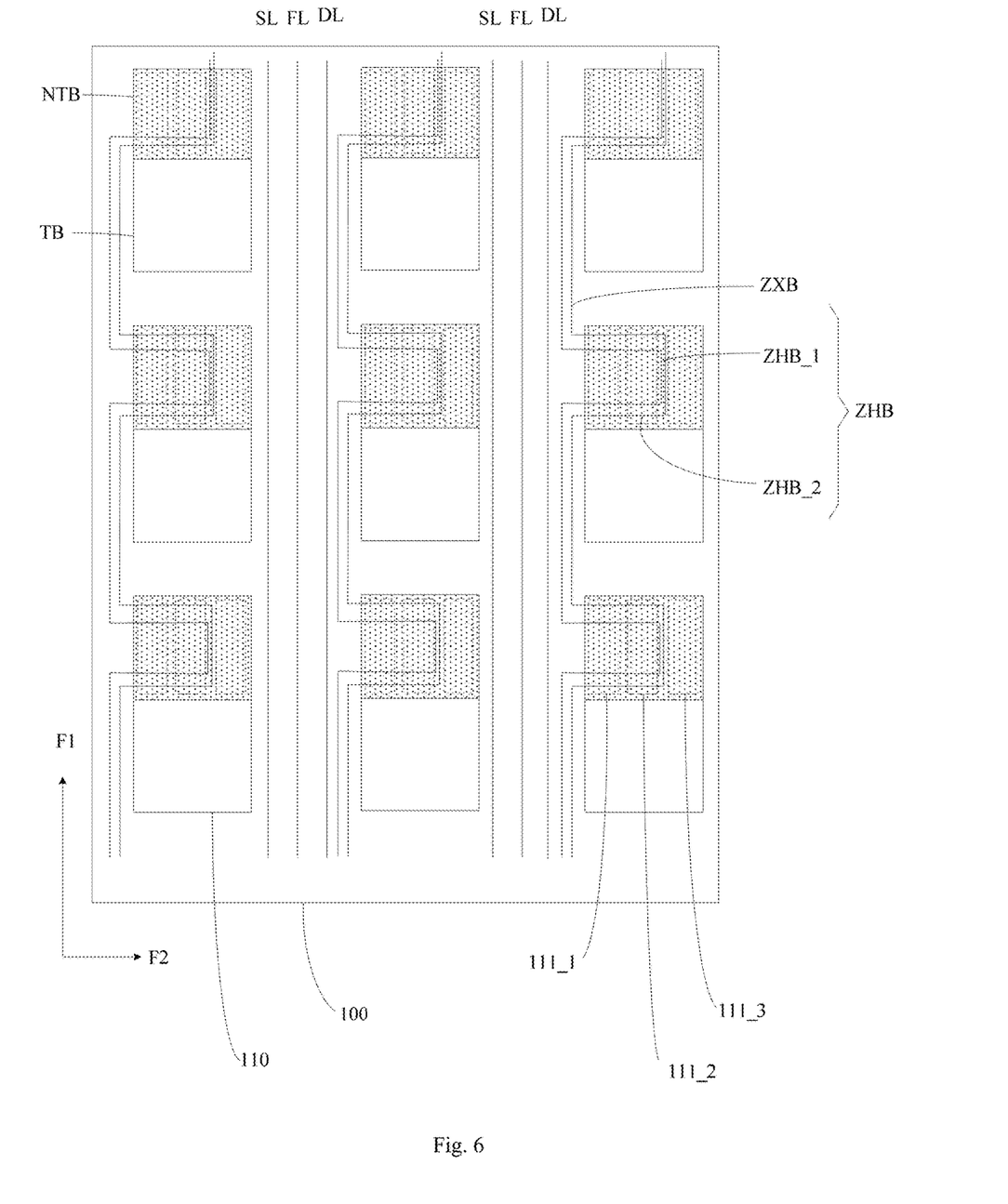
FIG. 6 is a second top-view of a display panel provided by an embodiment of the present disclosure.
Figure 7:
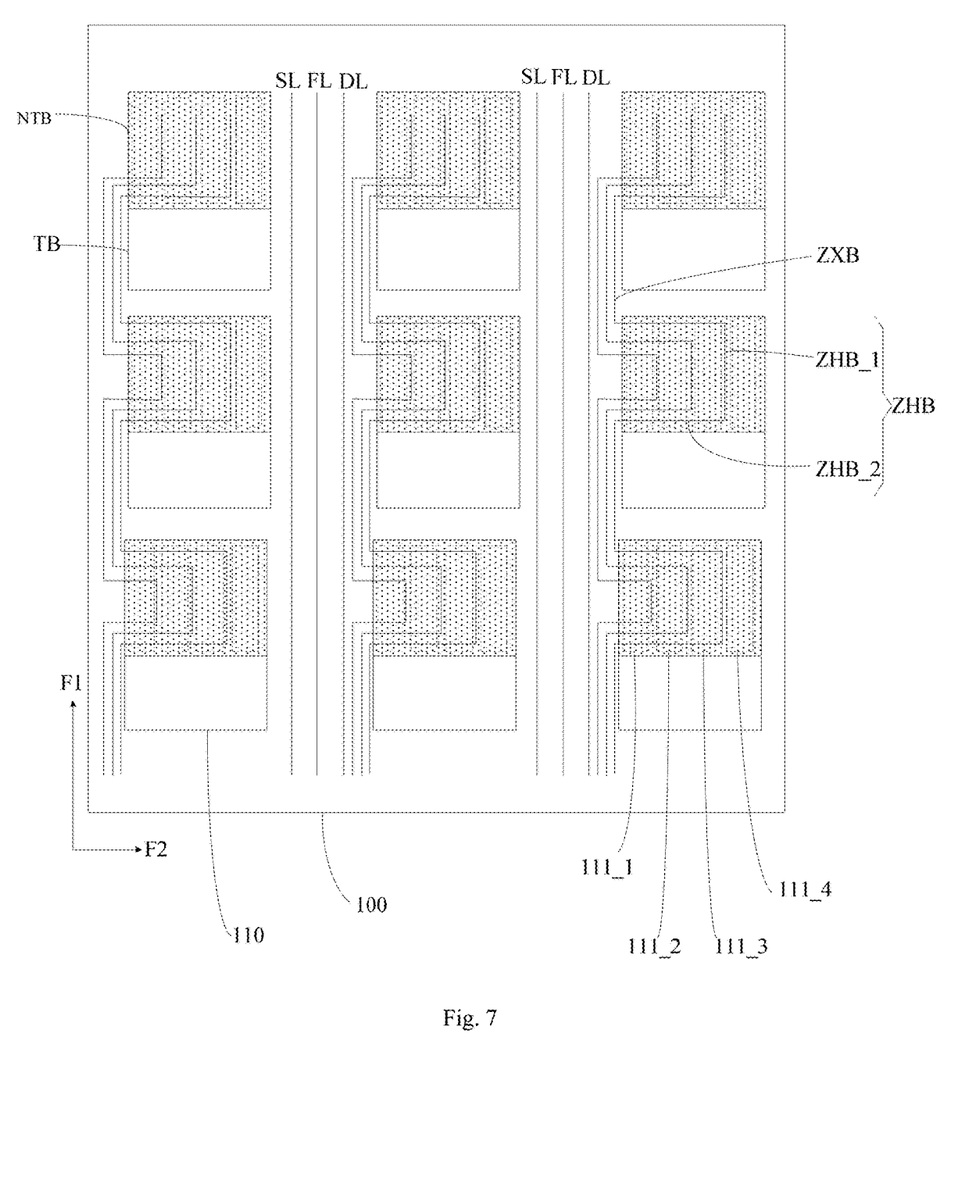
FIG. 7 is a third top-view of a display panel provided by an embodiment of the present disclosure.

In some embodiments, as shown in FIGS. 4, 6 and 7, for a column of pixel units 110, the data signal line DL located in the column gap corresponds to the nearest column of sub-pixels 111_$m$, and the data signal lines DL corresponding to the other columns of sub-pixels 111_$m$ are arranged around the transparent areas TB. Using the display panel in FIG. 4 as an example, for the middle column of pixel units 110, the data signal line DL in the column gap on the left side of the column of pixel units 110 corresponds to the leftmost column of sub-pixels 111_1 in the column of pixel units 110, and the data signal lines DL corresponding to the other columns of sub-pixels are arranged around the transparent area TB.

In some embodiments, as shown in FIGS. 4, 6 and 7, each of the data signal lines DL arranged around the transparent areas includes first segments ZXB located in the column gap and second segments located in the non-transparent areas ZHB; each of the second segments ZHB includes a first sub-segment ZHB_1 extending in a column direction F1 and second sub-segments ZHB_2 extending in a row direction F2; and the first sub-segment ZHB_1 is arranged in a gap between two adjacent sub-pixels.

In some embodiments, as shown in FIGS. 4 and 6, each pixel unit 110 may include three sub-pixels: a first sub-pixel 111_1, a second sub-pixel 111_2 and a third sub-pixel 111_3 successively arranged in the row direction F2. Where the first sub-pixel 111_1 may be a red sub-pixel, the second sub-pixel 111_2 may be a green sub-pixel, and the third sub-pixel 111_3 may be a blue sub-pixel; or the first sub-pixel 111_1 may be a green sub-pixel, the second sub-pixel 111_2 may be a blue sub-pixel, and the third sub-pixel 111_3 may be a red sub-pixel. Of course, these need to be designed and determined according to the actual application environment, which is not limited herein.

In some embodiments, as shown in FIG. 4, the data signal line DL corresponding to the first sub-pixel 111_1 extends in the column direction F1 to be arranged in the column gap between two adjacent pixel units 110, so that the data signal line DL, the detection signal line SL and the fixed voltage signal line FL are all arranged in the column gap. Exemplarily, the data signal line DL corresponding to the second sub-pixel 111_2 and the data signal line DL corresponding to the third sub-pixel 111_3 are both arranged around the transparent areas TB. The data signal lines DL corresponding to the second sub-pixel 111_2 and the third sub-pixel 111_3 may include first sub-segments ZXB located in the column gap and second sub-segments ZHB located in the non-transparent areas NTB. The first sub-segments ZHB_1 corresponding to the second sub-pixel 111_2 are arranged in gaps between the first sub-pixel 111_1 and the second sub-pixel 111_2, and the first sub-segments ZHB_1 corresponding to the third sub-pixel 111_3 is arranged in gaps between the second sub-pixel 111_2 and the third sub-pixel 111_3. In this way, the transparent areas TB may be free of the data signal line DL, the detection signal line SL and the fixed voltage signal line FL, thereby increasing the area of the transparent areas TB and reducing the haze. Moreover, the detection signal line SL and the data signal line DL on the left thereof are spaced at least by a distance of one sub-pixel, so that the interference with the detection signal line SL by the data signal line DL may be further reduced.

In some embodiments, as shown in FIG. 6, the data signal line DL corresponding to the first sub-pixel 111_1 extends along the column direction F1 to be arranged in the column gap between two adjacent pixel units 110. Thus, the data signal line DL, the detection signal line SL and the fixed voltage signal line FL are all arranged in the column gap. Exemplarily, the data signal line DL corresponding to the second sub-pixel 111_2 and the data signal line DL corresponding to the third sub-pixel 111_3 are both arranged around the transparent areas TB. The data signal lines DL corresponding to the second sub-pixel 111_2 and the third sub-pixel 111_3 may include first sub-segments ZXB located in the unit gap and second sub-segments ZHB located in the non-transparent areas NTB. The first sub-segments ZHB 1 corresponding to the second sub-pixel 111_2 and the first sub-segments ZHB_1 corresponding to the third sub-pixel 111_3 are both arranged in the gaps between the second sub-pixel 111_2 and the third sub-pixel 111_3. In this way, the transparent areas TB may be free of the data signal line DL, the detection signal line SL and the fixed voltage signal line FL, thereby increasing the area of the transparent areas TB and reducing the haze. Moreover, the detection signal line SL and the data signal line DL on the left thereof are spaced at least by a distance of one sub-pixel, so that the interference with the detection signal line SL by the data signal line DL may be further reduced.

In some embodiments, as shown in FIG. 7, the pixel unit 110 may also include four sub-pixels: a first sub-pixel 111_1, a second sub-pixel 111_2, a third sub-pixel 111_3 and a fourth sub-pixel 111_4 successively arranged in the row direction F2. The first sub-pixel 111_1 may be a red sub-pixel, the second sub-pixel 111_2 may be a green sub-pixel, the third sub-pixel 111_3 may be a blue sub-pixel, and the fourth sub-pixel 111_4 may be a white sub-pixel. Of course, the pixel unit 110 may also include five or six sub-pixels, which is not limited herein.

In some embodiments, as shown in FIG. 7, the data signal line DL corresponding to the first sub-pixel 111_1 extends along the column direction F1 to be arranged in the column gap between two adjacent pixel units 110. Thus, the data signal line DL, detection signal line SL and fixed voltage signal line FL are all arranged in the column gap. Exemplarily, the data signal line DL corresponding to the second sub-pixel 111_2, the data signal line DL corresponding to the third sub-pixel 111_3, and the data signal line DL corresponding to the fourth sub-pixel 111_4 are all arranged around the transparent areas TB. The data signal lines DL corresponding to the second sub-pixel 111_2, the third sub-pixel 111_3 and the fourth sub-pixel 111_4 may include first sub-segments ZXB located in the column gap and second sub-segments ZHB located in the non-transparent areas NTB. The first sub-segments ZHB_1 corresponding to the second sub-pixel 111_2 are arranged in gaps between the first sub-pixel 111_1 and the second sub-pixel 111_2, and the first sub-segments ZHB_1 corresponding to the third sub-pixel 111_3 are arranged in gaps between the second sub-pixel 111_2 and the third sub-pixel 111_3, and the first sub-segments ZHB_1 corresponding to the fourth sub-pixel 111_4 are arranged in gaps between the third sub-pixel 111_3 and the fourth sub-pixel 111_4. In this way, the transparent areas TB may be free of the data signal line DL, the detection signal line SL and the fixed voltage signal line FL, thereby increasing the area of the transparent areas TB and reducing the haze. Moreover, the detection signal line SL and the data signal line DL on the left thereof are spaced at least by a distance of one sub-pixel, so that the interference with the detection signal line SL by the data signal line DL may be further reduced.

Figure 8:
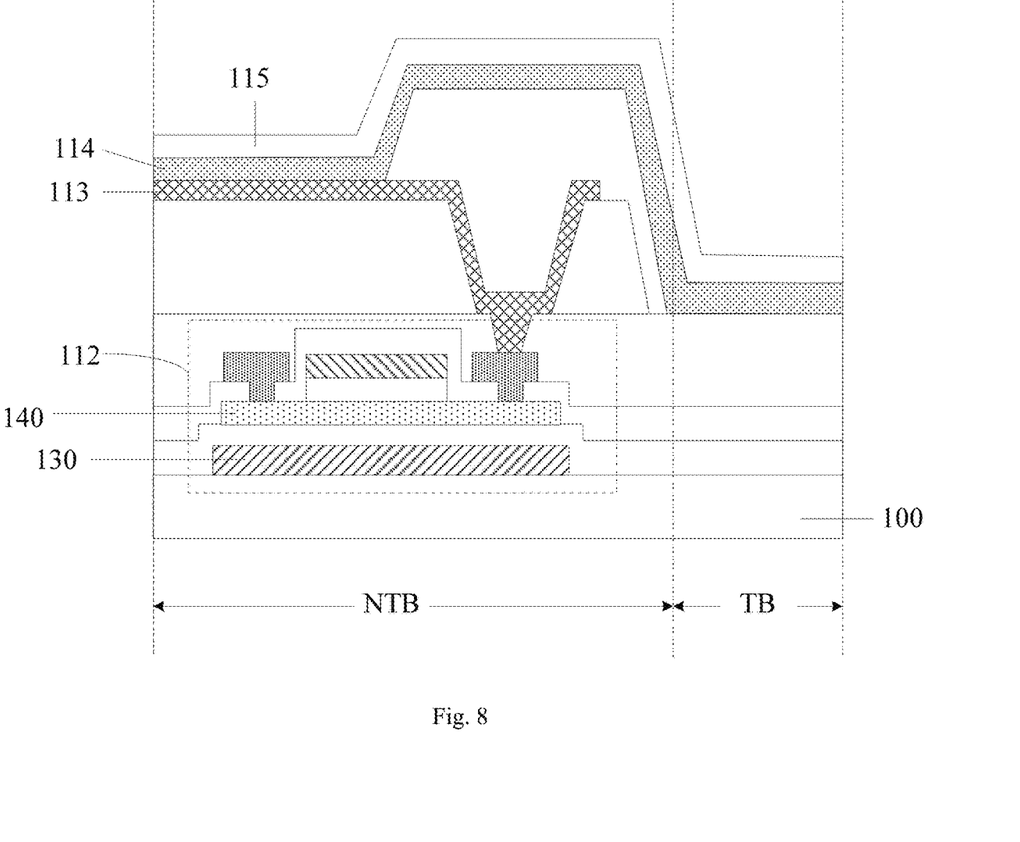
FIG. 8 is a partial sectional structural diagram of a display panel provided by an embodiment of the present disclosure.

In some embodiments, as shown in FIG. 8, each sub-pixel 111_m may include a thin film transistor 112, a first electrode 113, a light-emitting functional layer 114 and a second electrode 115, where the first electrode 113 is electrically connected with the thin film transistor 112; and an orthographic projection of an area where the thin film transistor 112 is located on the base substrate 100 and an orthographic projection of an area where the first electrode 113 is located on the base substrate 100 are both located in the non-transparent area NTB.

Specifically, the first electrode 113 may be a reflective anode, the second electrode 115 may be a transparent cathode, and a plurality of thin film transistors 112 in the sub-pixel may form a pixel circuit shown in FIG. 5 so that one pixel circuit is provided in each sub-pixel. Moreover, the pixel circuits in one column of sub-pixels are correspondingly connected to one data signal line DL, and all pixel circuits in one column of pixel units are correspondingly connected to one detection signal line SL. Further, the light-emitting functional layer 114 may include an organic light emitting material to implement the display panel as an OLED transparent display panel. Alternatively, the light-emitting functional layer 114 may also include a quantum dot light emitting material to implement the display panel as an QLED transparent display panel.

To prevent the influence of ambient light on an active layer in the thin film transistor, in some embodiments, as shown in FIG. 8, the thin film transistor in the pixel circuit is a top-gate thin film transistor. Each sub-pixel may further include a light-shielding layer 130 corresponding to at least one thin film transistor. The light-shielding layer 130 is located between the active layer 140 of the thin film transistor 112 and the base substrate 100, and in the same sub-pixel, an orthographic projection of the light-shielding layer 130 on the base substrate 100 covers an orthographic projection of the active layer 140 of the corresponding thin film transistor on the base substrate 100. Thus, light passing through the base substrate 100 can be blocked by the light-shielding layer 130 to improve the stability of the thin film transistor.

In some embodiments, each thin film transistor may correspond to one light-shielding layer respectively, so that each thin film transistor may be protected from ambient light, and the stability of all thin film transistors is improved.

In some embodiments, the light-shielding layer may be made of a conductive material. Specifically, the material of the light-shielding layer may include a metal, such as copper, aluminum, gold or silver. As the light-shielding layer has conductivity, in some embodiments, the light-shielding layer may be electrically connected to a gate of the corresponding thin film transistor. The light-shielding layer may also be used as the other gate of the thin film transistor to form a double-gate structure of the thin film transistor, thereby further improving the performance of the thin film transistor.

Of course, in some embodiments, the display panel may also be a liquid crystal display panel, which is not limited herein.

Based on the same inventive concept, an embodiment of the present disclosure further provides a display device including the above-mentioned display panel provided by embodiments of the present disclosure. The display device may be a mobile phone, a tablet computer, a television, a display, a notebook computer, a digital photo frame, a navigator, or any other product or component with a display function. Other indispensable components of the display device are present as understood by those skilled in the art, and are not described herein, nor should they be construed as limiting the present disclosure. For the implementation of the display device, reference may be made to the embodiments of the display panel described above, and repeated description is omitted.

In the display panel and the display device provided by the embodiments of the present disclosure, as the transparent areas are not provided with a plurality of data signal lines therein, not only can the amount of reflective metal passing through the transparent areas be reduced, but also areas originally used for arranging the data signal lines may be used as transparent areas to increase the area of the transparent areas, thereby increasing the transmittance, reducing the haze, and improving the display effect.

Evidently those skilled in the art may make various modifications and variations to the present disclosure without departing from the spirit and scope of the present disclosure. Thus, the present disclosure is also intended to encompass these modifications and variations thereto so long as the modifications and variations come into the scope of the claims appended to the present disclosure and their equivalents.

What is claimed is:

1. A display panel, comprising:
   a base substrate;
   a plurality of data signal lines on the base substrate; and
   a plurality of pixel units, wherein the plurality of pixel units each has a transparent area and a non-transparent area, and comprises a plurality of sub-pixels in the non-transparent area;
   wherein
   all sub-pixels of the display panel are arranged in an array;
   each column of sub-pixels corresponds to a respective one of the plurality of data signal lines; and
   at least part of the plurality of data signal lines being arranged around transparent areas;
   wherein the display panel further comprises:
   a plurality of fixed voltage signal lines, wherein no fixed voltage signal line is arranged in the transparent areas; and
   a plurality of detection signal lines, wherein each column of pixel units corresponds to a respective one of the plurality of detection signal lines; and no detection signal line is arranged in the transparent areas;
   wherein the plurality of detection signal lines, the plurality of data signal lines and the plurality of fixed voltage signal lines are located in column gaps between every two adjacent columns of pixel units; and in a same column gap, a detection signal line, data signal lines and a fixed voltage signal line extend in a column direction, and the fixed voltage signal line is located between the detection signal line and the data signal lines.

2. The display panel according to claim 1, wherein no data signal line is arranged in the transparent areas.

3. The display panel according to claim 1, wherein,
a data signal line completely located in the column gap corresponds to a nearest column of sub-pixels in one column of pixel units; and
a data signal line partially located in the column gap corresponds to other column of sub-pixels in the one column of pixel units and is arranged around the transparent areas of the one column of pixel units.

4. The display panel according to claim 3, wherein the data signal line arranged around the transparent areas comprises a first segment located in the column gap and a second segment located in the non-transparent areas of the one column of pixel units;
wherein the second segment comprises a first sub-segment extending in the column direction and a second sub-segment extending in a row direction; and the first sub-segment is arranged in a gap between two adjacent sub-pixels.

5. The display panel according to claim 4, wherein the plurality of pixel units each comprises a first sub-pixel, a second sub-pixel and a third sub-pixel arranged in that order in the row direction, wherein a data signal line corresponding to the first sub-pixel is arranged in the column gap;
a first sub-segment corresponding to the second sub-pixel is arranged in a gap between the first sub-pixel and the second sub-pixel, and a first sub-segment corresponding to the third sub-pixel is arranged in a gap between the second sub-pixel and the third sub-pixel; or
first sub-segments corresponding to the second sub-pixel and the third sub-pixel are both arranged in the gap between the second sub-pixel and the third sub-pixel.

6. The display panel according to claim 4, wherein the plurality of pixel units each comprises a first sub-pixel, a second sub-pixel, a third sub-pixel and a fourth sub-pixel arranged in that order in the row direction; a data signal line corresponding to the first sub-pixel is arranged in the column gap; and
a first sub-segment corresponding to the second sub-pixel is arranged in a gap between the first sub-pixel and the second sub-pixel, a first sub-segment corresponding to the third sub-pixel is arranged in a gap between the second sub-pixel and the third sub-pixel, and a first sub-segment corresponding to the fourth sub-pixel is arranged in a gap between the third sub-pixel and the fourth sub-pixel.

7. The display panel according to claim 1, wherein the plurality of fixed voltage signal lines comprise one of high voltage power lines, reference voltage signal lines and initialization voltage signal lines.

8. The display panel according to claim 1, wherein the plurality of sub-pixels each comprises a thin film transistor, a first electrode, a light-emitting functional layer and a second electrode, wherein the first electrode is electrically connected with the thin film transistor; and
an orthographic projection of an area where the thin film transistor is located on the base substrate and an orthographic projection of an area where the first electrode is located on the base substrate are both located in the non-transparent area.

9. The display panel according to claim 8, wherein the thin film transistor is a top-gate thin film transistor; and the plurality of sub-pixels each further comprises a light-shielding layer corresponding to at least one of the thin film transistor;
wherein
the light-shielding layer is disposed between an active layer of the thin film transistor and the base substrate; and
an orthographic projection of the light-shielding layer on the base substrate covers an orthographic projection of the active layer of a corresponding thin film transistor on the base substrate.

10. The display panel according to claim 9, wherein the light-shielding layer is made of a conductive material; and the light-shielding layer is electrically connected to a gate of the corresponding thin film transistor.

11. The display panel according to claim 9, wherein each thin film transistor corresponds to one light-shielding layer.

12. A display device, comprising a display panel, wherein the display panel comprises:
a base substrate;
a plurality of data signal lines on the base substrate; and
a plurality of pixel units, wherein the plurality of pixel units each has a transparent area and a non-transparent area, and comprises a plurality of sub-pixels in the non-transparent area;
wherein
all sub-pixels of the display panel are arranged in an array;
each column of sub-pixels corresponds to a respective one of the plurality of data signal lines; and
at least part of the plurality of data signal lines being arranged around transparent areas;
wherein the display panel further comprises:
a plurality of fixed voltage signal lines, wherein no fixed voltage signal line is arranged in the transparent areas; and
a plurality of detection signal lines, wherein each column of pixel units corresponds to a respective one of the plurality of detection signal lines; and no detection signal line is arranged in the transparent areas;
wherein the plurality of detection signal lines, the plurality of data signal lines and the plurality of fixed voltage signal lines are located in column gaps between every two adjacent columns of pixel units; and in a same column gap, a detection signal line, data signal lines and a fixed voltage signal line extend in a column direction, and the fixed voltage signal line is located between the detection signal line and the data signal lines.

13. The display device according to claim 12, wherein no data signal line is arranged in the transparent areas.

14. The display device according to claim 12, wherein,
a data signal line completely located in the column gap corresponds to a nearest column of sub-pixels in one column of pixel units; and
a data signal line partially located in the column gap corresponds to other column of sub-pixels in the one column of pixel units and is arranged around the transparent areas of the one column of pixel units.

* * * * *